(12) United States Patent
Ohsawa et al.

(10) Patent No.: US 8,729,623 B2
(45) Date of Patent: May 20, 2014

(54) NONVOLATILE SEMICONDUCTOR MEMORY DEVICE

(75) Inventors: Tomo Ohsawa, Kanagawa-ken (JP); Yosuke Komori, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 167 days.

(21) Appl. No.: 13/423,464

(22) Filed: Mar. 19, 2012

(65) Prior Publication Data

US 2013/0075742 A1      Mar. 28, 2013

(30) Foreign Application Priority Data

Sep. 22, 2011   (JP) ................................. 2011-208205

(51) Int. Cl.
*H01L 29/792*     (2006.01)
(52) U.S. Cl.
USPC ............ 257/324; 257/314; 257/319; 438/287
(58) Field of Classification Search
USPC .............. 257/4, 314, 324, 288, 319; 438/287, 438/585
See application file for complete search history.

(56) References Cited

U.S. PATENT DOCUMENTS

| 2010/0207195 | A1 | 8/2010 | Fukuzumi et al. |
| 2011/0031547 | A1 | 2/2011 | Watanabe |
| 2011/0115014 | A1 | 5/2011 | Ichinose et al. |
| 2011/0216604 | A1* | 9/2011 | Mikajiri et al. .......... 365/185.26 |
| 2012/0235220 | A1* | 9/2012 | Sekine et al. ................. 257/324 |
| 2012/0235221 | A1* | 9/2012 | Ishiduki et al. ............... 257/324 |
| 2012/0267699 | A1* | 10/2012 | Kiyotoshi ..................... 257/319 |
| 2013/0056814 | A1* | 3/2013 | Higuchi ........................ 257/314 |
| 2013/0056815 | A1* | 3/2013 | Ishiduki et al. ............... 257/314 |
| 2013/0119456 | A1* | 5/2013 | Kito et al. ..................... 257/324 |

FOREIGN PATENT DOCUMENTS

| JP | 200431691 | 1/2004 |
| JP | 2009-146954 | 7/2009 |
| JP | 2011-40533 | 2/2011 |
| JP | 2011-108921 | 6/2011 |

OTHER PUBLICATIONS

Japanese Office Action dated Jan. 27, 2014, in Japanese Patent Application No. 2011-208205 filed Sep. 22, 2011 (with English Translation).

* cited by examiner

*Primary Examiner* — Thanh Y Tran
(74) *Attorney, Agent, or Firm* — Oblon, Spivak, McClelland, Maier & Neustadt, L.L.P.

(57) ABSTRACT

According to one embodiment, a nonvolatile semiconductor memory device includes: a stacked body including a plurality of electrode layers and a plurality of insulating layers, which are alternately stacked, and diffusion suppressing layers each provided between each of the plurality of electrode layers and each of the plurality of insulating layers; and a memory film provided on a side wall of a hole penetrating the stacked body in a stacking direction. Each of the plurality of electrode layers is a first semiconductor layer containing a first impurity element. The diffusion suppressing layer is a second semiconductor layer containing a second impurity element which is different from the first impurity element. The diffusion suppressing layer is a film having an effect of suppressing diffusion of the first impurity element.

16 Claims, 11 Drawing Sheets

NONVOLATILE SEMICONDUCTOR MEMORY DEVICE

CROSS-REFERENCE TO RELATED APPLICATIONS

This application is based upon and claims the benefit of priority from the prior Japanese Patent Application No. 2011-208205, filed on Sep. 22, 2011; the entire contents of which are incorporated herein by reference.

FIELD

Embodiments described herein relate generally to a nonvolatile semiconductor memory device.

BACKGROUND

There is a memory device in which memory cells are three-dimensionally aligned by forming a memory hole in a stacked body where a plurality of electrode layers functioning as control gates in the memory cells and a plurality of insulating layers are alternately stacked, forming a charge storage film on a side wall of the memory hole, and then providing silicon serving as a channel in the memory hole.

In this type of memory device, there is a U-shaped memory string structure that includes: a pair of columnar parts extending in a stacking direction of the stacked body including a plurality of electrode layers; and a coupling part embedded in a back gate and connecting the pair of columnar parts.

Before the formation of the stacked body including the electrode layers, a concave portion (a space portion) is formed in a foundation layer serving as the back gate, and a sacrifice film is embedded in the concave portion. After that, a stacked body including sacrifice layers formed between each of the plurality of electrode layers and each of the plurality of electrode layers is formed on the foundation layer and then, a hole of the columnar part is formed, and the sacrifice film in the concave portion and the sacrifice layers are selectively removed through the hole by etching. After that, a charge storage film and a channel body layer are formed in the hole, in the concave portion and between the plurality of electrode layers, and thus the nonvolatile semiconductor memory device is formed.

However, each of the plurality of electrode layers contains an impurity element. When the impurity element diffuses to the sacrifice layers during the manufacturing process, the sacrifice layers may not be sufficiently removed by etching. Furthermore, data retention may degrade due to an electric field generated at an edge portion of the electrode layer.

DETAILED DESCRIPTION

In general, according to one embodiment, a nonvolatile semiconductor memory device includes: a stacked body including a plurality of electrode layers and a plurality of insulating layers, which are alternately stacked, and diffusion suppressing layers each provided between each of the plurality of electrode layers and each of the plurality of insulating layers; a memory film provided on a side wall of a hole penetrating the stacked body in a stacking direction; and a channel body layer provided on the memory film. Each of the plurality of electrode layers is a first semiconductor layer containing a first impurity element. The diffusion suppressing layer is a second semiconductor layer containing a second impurity element which is different from the first impurity element. The diffusion suppressing layer is a film having an effect of suppressing diffusion of the first impurity element.

In general, according to one embodiment, a nonvolatile semiconductor memory device includes: a stacked body including a plurality of electrode layers and a plurality of insulating layers, which are alternately stacked, and diffusion suppressing layers each provided between each of the plurality of electrode layers and each of the plurality of insulating layers; and a memory film provided on a side wall of a hole penetrating the stacked body in a stacking direction. Each of the plurality of electrode layers is a first semiconductor layer containing a first impurity element. The diffusion suppressing layer is a second semiconductor layer containing a second impurity element which is different from the first impurity element. The diffusion suppressing layer is a film having an effect of suppressing diffusion of the first impurity element.

Embodiments of the invention will be described with reference to the drawings. In the following descriptions, like members are marked with like numerals, and the description of the described members is omitted as appropriate.

First Embodiment

First, before describing the manufacturing method of a nonvolatile semiconductor memory device of the embodiments, a nonvolatile semiconductor memory device manufactured according to the manufacturing method will be described with reference to a schematic perspective view.

Figure 1:
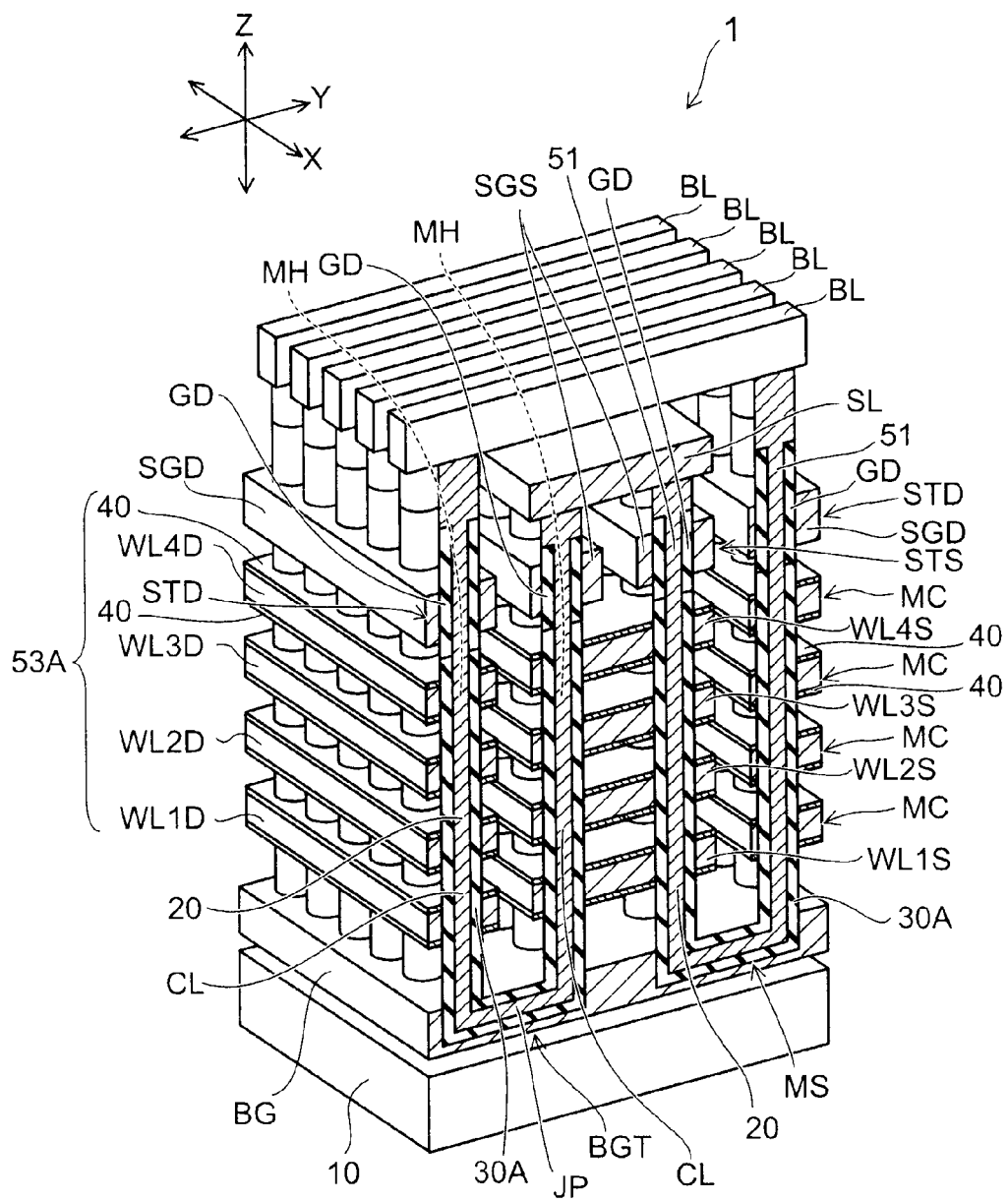
FIG. 1 is a schematic perspective view showing a memory cell array in the nonvolatile semiconductor memory according to a first embodiment.

FIG. 1 is a schematic perspective view showing a memory cell array in the nonvolatile semiconductor memory device according to a first embodiment.

In FIG. 1, for clarification, an insulating part other than an insulating film formed on an inner wall of a memory hole MH is not shown. This insulating part will be described with reference to FIG. 6B as a schematic cross-sectional view of the memory cell array.

Figure 2:
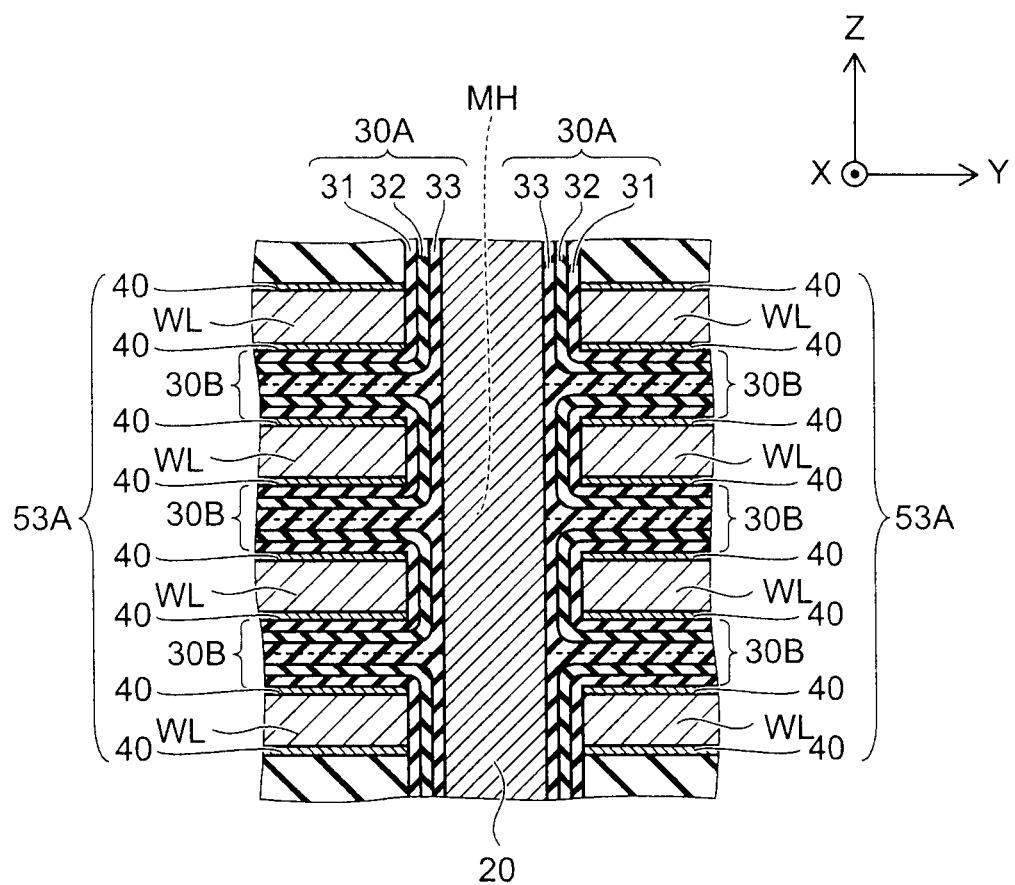
FIG. 2 is an enlarged cross-sectional view showing the region in which memory cells in FIG. 1 are provided.

FIG. 2 is an enlarged cross-sectional view showing the region in which memory cells in FIG. 1 are provided.

In FIG. 1, for convenience of explanation, an XYZ rectangular coordinate system is introduced. In this coordinate system, two directions which are parallel to a major surface of a substrate 10 and which are orthogonal to each other are defined as an X-direction and a Y-direction, and a direction which is orthogonal to both the X-direction and the Y-direction is defined as a Z-direction.

Figure 3A:
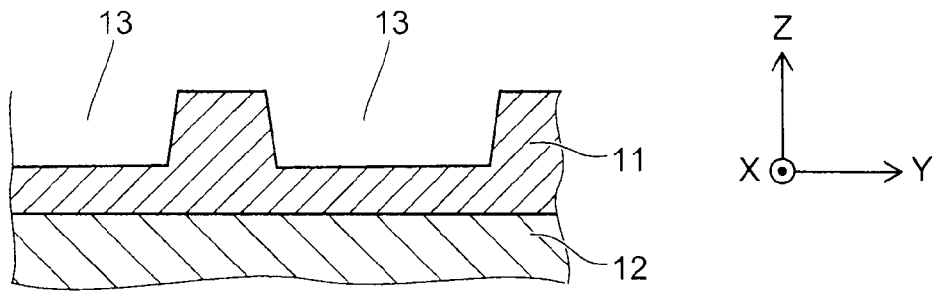
FIGS. 3A to 3C are schematic cross-sectional views for explaining a manufacturing process of the nonvolatile semiconductor memory device according to the first embodiment.

In the nonvolatile semiconductor memory device 1, a back gate BG is provided on the substrate 10 via an insulating layer not shown. The substrate 10 and the insulating layer constitute a foundation layer. An active element such as a transistor and a passive element such as a resistor and a capacitor may be provided in the substrate 10. The back gate BG is, for example, a silicon (Si) layer to which an impurity element is added and which has electrical conductivity. In FIG. 3A, a semiconductor layer (phosphorized silicon layer) 11 corresponds to the back gate BG.

A plurality of insulating films 30B (refer to FIG. 2) and a plurality of electrode layers WL1D, WL2D, WL3D, WL4D, WL1S, WL2S, WL3S, and WL4S are alternately stacked on the back gate BG.

The electrode layer WL1D and the electrode layer WL1S are provided on the same layer and represent the first electrode layers from the bottom. The electrode layer WL2D and the electrode layer WL2S are provided on the same layer and represent the second electrode layers from the bottom. The electrode layer WL3D and the electrode layer WL3S are provided on the same layer and represent the third electrode layers from the bottom. The electrode layer WL4D and the electrode layer WL4S are provided on the same layer and represent the fourth electrode layers from the bottom.

The electrode layer WL1D is separated from the electrode layer WL1S in the Y-direction. The electrode layer WL2D is separated from the electrode layer WL2S in the Y-direction. The electrode layer WL3D is separated from the electrode layer WL3S in the Y-direction. The electrode layer WL4D is separated from the electrode layer WL4S in the Y-direction.

Figure 6A:
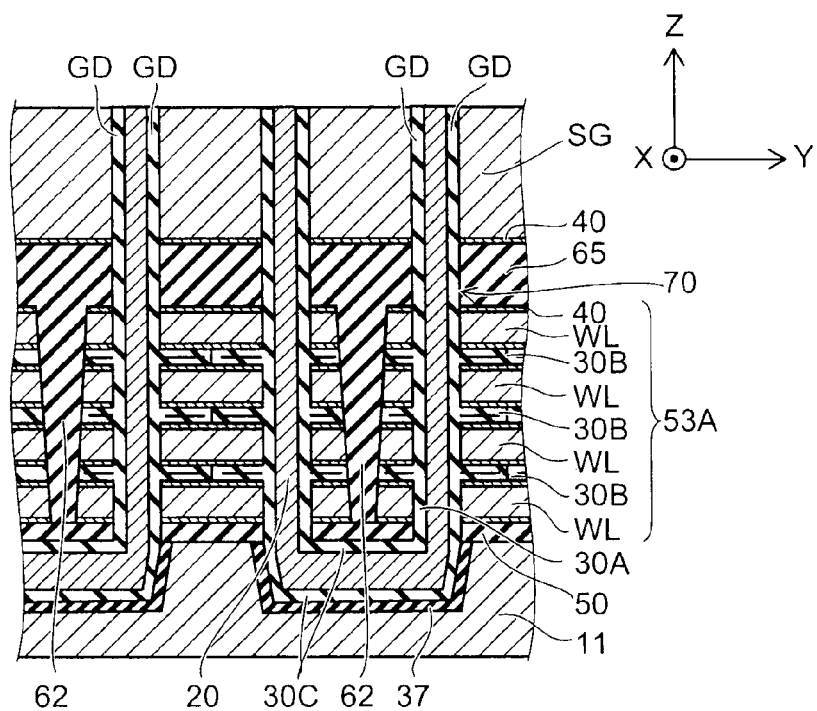
FIGS. 6A and 6B are schematic cross-sectional views for explaining a manufacturing process of the nonvolatile semiconductor memory device according to the first embodiment.
Figure 6B:
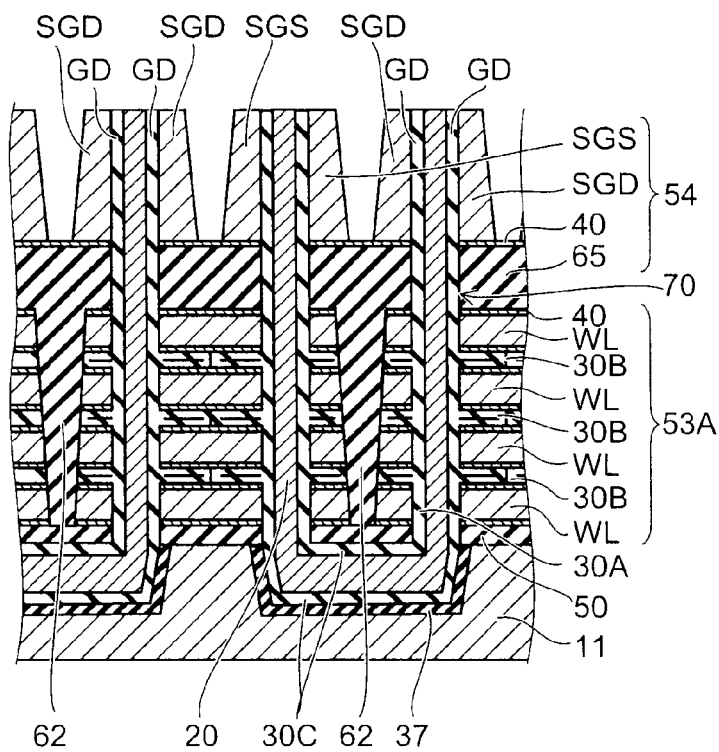

Insulating layers 62 shown in FIG. 6B are provided between the electrode layer WL1D and the electrode layer WL1S, between the electrode layer WL2D and the electrode layer WL2S, between the electrode layer WL3D and the electrode layer WL3S, between the electrode layer WL4D and the electrode layer WL4S, between the adjacent electrode layers WL1S, between the adjacent electrode layers WL2S, between the adjacent electrode layers WL3S and between the adjacent electrode layers WL4S.

The electrode layers WL1D, WL2D, WL3D, and WL4D are provided between the back gate BG and a drain side selection gate SGD. Diffusion suppressing layers 40 are provided on and under each of the electrode layers WL1D, WL2D, WL3D, and WL4D. The electrode layers WL1S, WL2S, WL3S, and WL4S are provided between the back gate BG and a source side selection gate SGS. The diffusion suppressing layers 40 are provided on and under each of the electrode layers WL1S, WL2S, WL3S, and WL4S.

The number of the electrode layers WL1D, WL2D, WL3D, WL4D, WL1S, WL2S, WL3S, and WL4S are optional and is not limited to four as shown in FIG. 1. In the following description, there is a case in which each of the electrode layers WL1D, WL2D, WL3D, WL4D, WL1S, WL2S, WL3S, and WL4S is expressed merely as the electrode layer WL.

Each of the plurality of electrode layers WL is, for example, a conductive semiconductor layer containing an impurity element (first impurity element). The impurity element is a group XIII element such as boron (B). Alternatively, a group XV element such as phosphorus (P) and arsenic (As) may be used as the impurity element. In the following description, a boron-containing polysilicon layer is employed as an example of the electrode layer WL. The diffusion suppressing layer 40 is a semiconductor layer (for example, polysilicon layer) containing an impurity element other than the first impurity element (second impurity element). Examples of the second impurity element include carbon (C). The diffusion suppressing layers 40 suppress the diffusion of the first impurity element from the electrode layers WL to the outside of the electrode layers WL. That is, the polysilicon layer which forms the diffusion suppressing layer 40 has a greater effect of suppressing the diffusion of the first impurity element in a state in which the second impurity element such as carbon (C) is introduced as compared with a state in which the second impurity element is not introduced. The insulating films 30B each have, for example, ONO structure described later.

In the embodiment, the stacked structure having the plurality of electrode layers WL and the plurality of insulating films 30B, which are alternately stacked, and the diffusion suppressing layers 40 provided between each of the plurality of electrode layers WL and each of the plurality of insulating films 30B constitute a stacked body 53A. The stacked body 53A is provided on the foundation layer.

The drain side selection gate SGD is provided on the electrode layers WL4D via an insulating layer not shown. The drain-side selection gate SGD is, for example, a silicon layer to which an impurity element is added and which has sufficient electrical conductivity.

The source side selection gate SGS is provided on the electrode layers WL4S via an insulating layer not shown. The source side selection gate SGS is, for example, a silicon layer to which an impurity element is added and which has electrical conductivity.

The drain side selection gate SGD is separated from the source side selection gate SGS in the Y-direction. In the following description, there is a case in which each of the drain side selection gate SGD and the source side selection gate SGS is expressed merely as a selection gate SG without distinguishing them from each other.

A source line SL is provided on the source side selection gate SGS via an insulating layer not shown. The source line SL is a metal layer or a silicon layer to which an impurity element is added and which has electrical conductivity.

A plurality of bit lines BL are provided on the drain side selection gate SGD and the source line SL via an insulating layer not shown. Each of the bit lines BL extends in the Y-direction.

The plurality of U-shaped memory holes MH are formed in the back gate BG and the stacked body 53A on the back gate BG. For example, the hole which penetrates the electrode layers WL1D to WL4D and the drain side selection gate SGD and extends in the Z-direction is formed. The hole which penetrates the electrode layers WL1S to WL4S and the source side selection gate SGS and extend in the Z-direction is formed. The pair of holes extending in the Z-direction are connected to each other through a concave portion (space portion) formed in the back gate BG to constitute the U-shaped memory hole MH.

A U-shaped channel body layer 20 is provided within the memory hole MH. The channel body layer 20 is, for example, an additive-free polysilicon layer. A memory film 30A is provided between the channel body layer 20 and an inner wall of the memory hole MH.

In other words, the memory film 30A is provided on a side wall of the memory hole MH penetrating the stacked body 53A in the stacking direction of the stacked body 53A. The channel body layer 20 is provided on the memory film 30A formed in the memory hole MH. In addition, each of the plurality of electrode layers WL is a gate electrode facing the channel body layer 20 via the memory film 30A.

A gate insulating film GD is provided between the channel body layer 20 and the drain side selection gate SGD. The gate insulating film GD is provided between the channel body layer 20 and the source side selection gate SGS.

The structure is not limited to the one in which the whole of the memory hole MH is filled with the channel body layer 20, and may be the one in which the channel body layer 20 is formed so as to leave a cavity on the side of the central axis of the memory hole MH and an insulant is filled in the inner cavity.

The memory film 30A has, for example, ONO (Oxide-Nitride-Oxide) structure in which a silicon nitride film is sandwiched between a pair of silicon oxide films. As shown in FIG. 2, an insulating film 31, a charge storage film 32 and an insulating film 33 are provided between each of the electrode layers WL and the channel body layer 20 in this order from the side of the electrode layers WL. A set of the insulating film 31, the charge storage film 32 and the insulating film 33 constitutes the memory film 30A. The insulating film 31 contacts the electrode layers WL, the insulating film 33 contacts the channel body layer 20, and the charge storage film 32 is provided between the insulating film 31 and the insulating film 33. The insulating films 30B are two opposed layers having the ONO structure.

The channel body layer 20 functions as a channel of a transistor constituting the memory cell, the electrode layers WL function as control gates and the charge storage film 32 functions as a data storage layer that stores a charge injected from the channel body layer 20. That is, at a crossing part of the channel body layer 20 and each of the electrode layers WL, a memory cell MC having the structure in which the control gate surrounds the circumference of the channel is formed.

A nonvolatile semiconductor memory device 1 of an embodiment is a nonvolatile semiconductor memory device capable of performing erasing and writing of data electrically freely, and of holding a memory content even if the power is turned off.

The memory cell MC is, for example, a charge trap-type memory cell. The charge storage film 32 has a lot of trap sites for trapping electrical charge (electron) and is, for example, a silicon nitride film. The insulating film 33 is, for example, a silicon oxide film and serves as a potential barrier when the charge is injected from the channel body layer 20 to the charge storage film 32 or the charge stored in the charge storage film 32 is diffused into the channel body layer 20. The insulating film 31 is, for example, a silicon oxide film and prevents the charge stored in the charge storage film 32 from diffusing into the electrode layers WL. The insulating film 31 and the insulating film 33 each may be formed of a plurality of layers.

The drain side selection gate SGD, the channel body layer 20 and the gate insulating film GD between the drain side selection gate SGD and the channel body layer 20 constitute a drain side selection transistor STD. The channel body layer 20 on the drain side selection transistor STD is connected to the bit lines BL.

The source side selection gate SGS, the channel body layer 20 and the gate insulating film GD between the source side selection gate SGS and the channel body layer 20 constitute a source side selection transistor STS. The channel body layer 20 on the source side selection transistor STS is connected to the source line SL.

The back gate BG, the channel body layer 20 provided in the back gate BG and the memory film 30A constitutes a back gate transistor BGT.

The plurality of memory cells MC using the respective electrode layers WL4D to WL1D as the control gates are provided between the drain side selection transistor STD and the back gate transistor BGT. Similarly, the plurality of memory cells MC using the respective electrode layers WL1S to WL4S as the control gates are provided between the back gate transistor BGT and the source side selection transistor STS.

These plurality of memory cells MC, the drain side selection transistor STD, the back gate transistor BGT and the source side selection transistor STS are connected in series through the channel body layer 20 to constitute one U-shaped memory string MS.

The one memory-strings MS has a pair of columnar parts CL extending in a stacking direction of the stacked body 53A including a plurality of electrode layers WL, and a coupling part JP which is embedded in the back-gate BG and couples the pair of the columnar parts CL. By the plurality of memory-strings MS being aligned in the X-direction and the Y-direction, a plurality of memory cells MC are provided in the X-direction, the Y-direction and the Z-direction three-dimensionally.

The plurality of memory strings MS are provided in a memory cell array region in the substrate 10. In the periphery, for example, of the memory cell array region in the substrate 10, a peripheral circuit which controls the memory cell array is provided.

Next, a manufacturing process of the nonvolatile semiconductor memory device 1 will be described.

FIGS. 3 to 6 are schematic cross-sectional views for explaining the manufacturing process of the nonvolatile semiconductor memory device according to the first embodiment. The following schematic cross-sectional views are cross-sectional views obtained by cutting the center of the memory hole MH in parallel to the Y-direction in FIG. 1.

First, as shown in FIG. 3A, the semiconductor layer 11 containing the impurity element is formed on a foundation layer 12. The semiconductor layer 11 is, for example, a silicon layer to which phosphorus is added. The phosphorus-added silicon layer corresponds to the above-mentioned back gate BG. The foundation layer 12 has, for example, a transistor and wiring of a peripheral circuit part controlling the memory cell, an interlayer insulating film and so on.

Subsequently, a groove 13 is formed in the semiconductor layer 11 according to a photolithography process. The location of the groove 13 corresponds to the location of the coupling part JP coupling a lower end of the memory hole MH to the semiconductor layer 11.

Figure 3B:
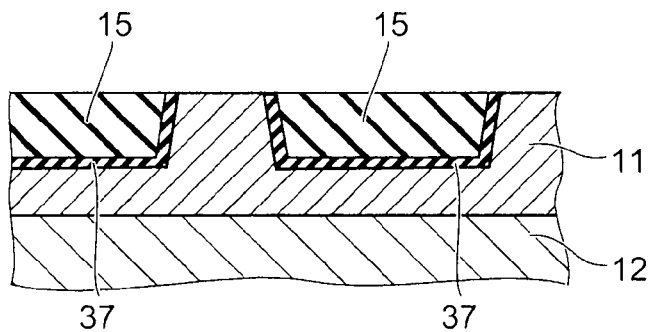

Next, as shown in FIG. 3B, an insulating film 37 is formed in the groove 13 and an additive-free silicon sacrifice film 15 is formed in the groove 13 via the insulating film 37. The additive-free silicon sacrifice film 15 is, for example, an undoped silicon film. An excessive part of the additive-free silicon sacrifice film 15 is removed by etching-back, and thus the surface of the semiconductor layer 11 is exposed between adjacent additive-free silicon sacrifice films 15.

In this stage, the semiconductor layer 11 having an impurity-containing region containing an impurity element and a to-be-etched region having an impurity concentration lower than a concentration of the impurity-containing region are formed on the foundation layer 12. The impurity-containing region is the semiconductor layer 11 sandwiched between the adjacent additive-free silicon sacrifice films 15, and the to-be-etched region is the additive-free silicon sacrifice film 15. The plurality of additive-free silicon sacrifice films 15 are arranged at predetermined intervals in the X-direction and the Y-direction.

Figure 3C:
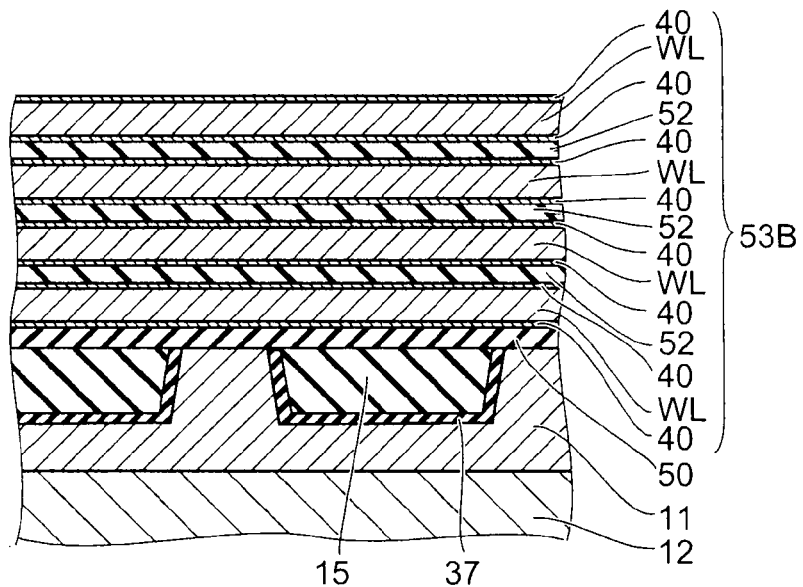

Next, as shown in FIG. 3C, an insulating layer 50 is formed on the semiconductor layer 11 and the additive-free silicon sacrifice film 15. The insulating layer 50 functions as a stop layer at the time of etching. The material for the insulating layer 50 is, for example, silicon oxide ($SiO_2$).

Subsequently, a stacked body 53B is formed on the foundation layer 12 via the insulating layer 50. The stacked body 53B includes a plurality of electrode layers WL and a plurality of to-be-etched layers 52, which are alternately stacked, and the diffusion suppressing layers 40 provided between each of the plurality of electrode layers WL and each of the plurality of to-be-etched layers 52.

The stacked body 53B is a stacked body obtained by stacking the electrode layers WL and the to-be-etched layers 52 in multi-stages. The stacked body 53B includes the to-be-etched layer 52 between each of the plurality of electrode layers WL. The electrode layers WL is, for example, a boron-added polysilicon layer. The electrode layers WL have sufficient electrical conductivity as gate electrodes. The to-be-etched layers 52 are additive-free polysilicon layers. The diffusion suppressing layers 40 are carbon-added polysilicon layers.

Figure 4A:
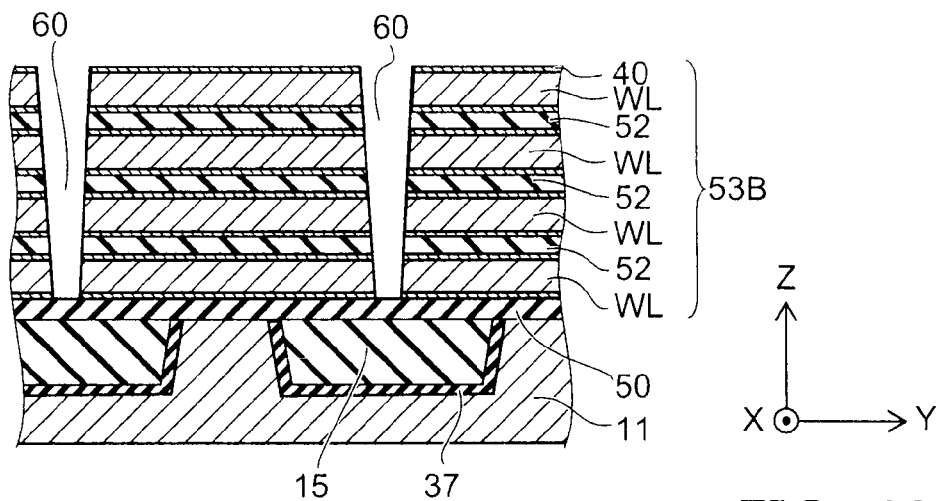
FIGS. 4A to 4C are schematic cross-sectional views for explaining a manufacturing process of the nonvolatile semiconductor memory device according to the first embodiment.

In FIG. 4A and subsequent figures, indication of the foundation layer 12 will be omitted.

As shown in FIG. 4A, a slit 60 extending from the surface of the stacked body 53B to the insulating layer 50 by the photolithography process is formed. The slit 60 extends in the X-direction. In this stage, the stacked body 53B is divided by the slit 60 in the Y-direction. At this time, the insulating layer 50 functions as an etching stop layer. That is, the existence of the insulating layer 50 suppresses overetching, and thus a lower end of the slit 60 does not reach the additive-free silicon sacrifice film 15.

Figure 4B:
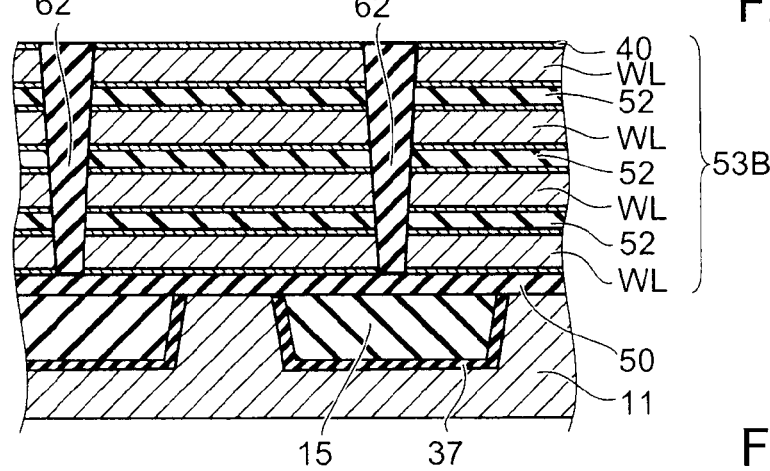

Next, as shown in FIG. 4B, the insulating layer 62 is formed in the slit 60. The material for the insulating layer 62 is, for example, nitride silicon ($Si_3N_4$). An excessive part of the insulating layer 62 is removed by etching-back as necessary to expose the surface of the uppermost diffusion suppressing layer 40.

Figure 4C:
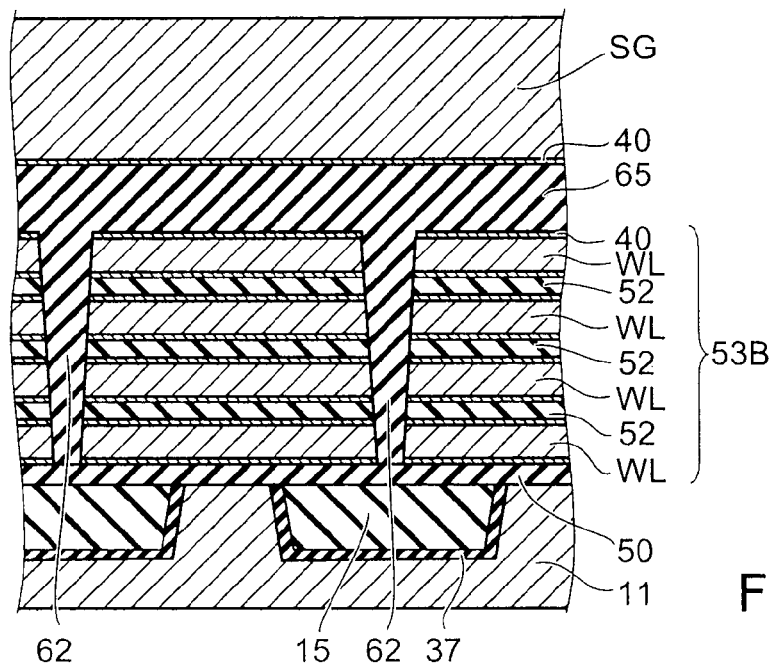

Then, as shown in FIG. 4C, an interlayer insulating film 65 is formed on the stacked body 53B and the insulating layer 62. The interlayer insulating film 65 is, for example, an silicon oxide film. Subsequently, the diffusion suppressing layers 40 is formed on the interlayer insulating film 65 as necessary. After that, the selection gate SG is formed on the interlayer insulating film 65 via the diffusion suppressing layer 40. By interposing the diffusion suppressing layer 40 also between the interlayer insulating film 65 and the selection gate SG, boron is prevented from diffusing into the interlayer insulating film 65. This suppresses damage of the surface of the interlayer insulating film 65 due to treatment using a hydrofluoric acid-based solution. The material for the selection gate SG is boron-added silicon. In addition, an oxide film (not shown) for protecting the selection gate SG is formed on the selection gate SG.

Figure 5A:
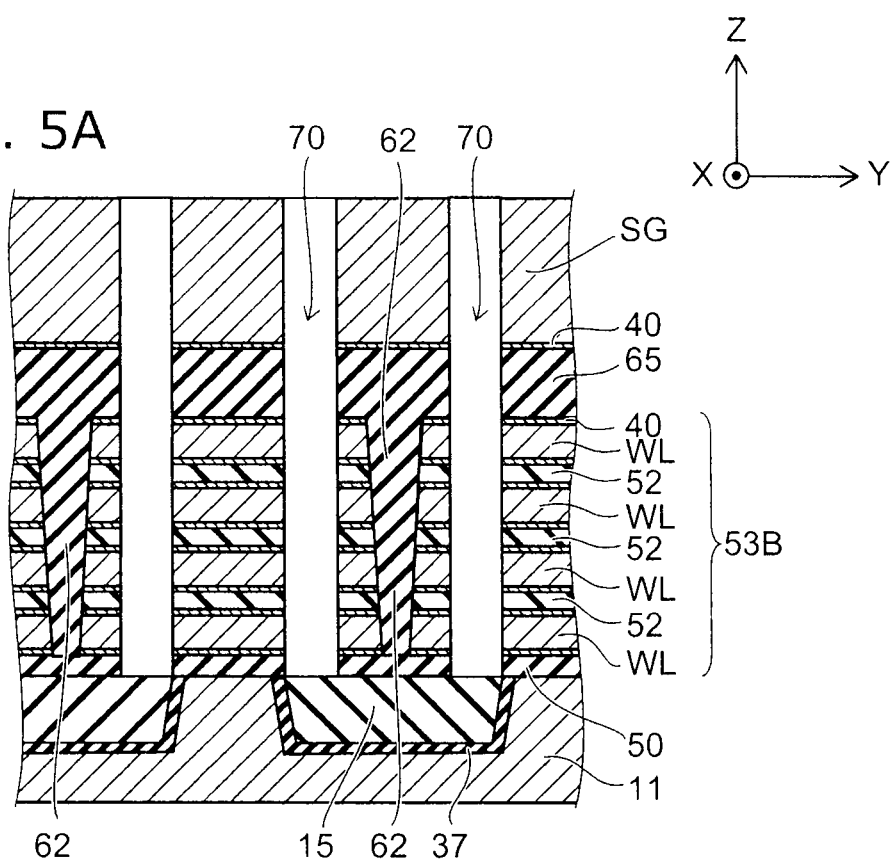
FIGS. 5A and 5B are schematic cross-sectional views for explaining a manufacturing process of the nonvolatile semiconductor memory device according to the first embodiment.

Next, as shown in FIG. 5A, a pair of holes 70 reaching the additive-free silicon sacrifice film 15 (to-be-etched region) is formed in the stacked body 53B by the photolithography process. The pair of holes 70 sandwiches the insulating layer 62 therebetween and penetrates from an upper face to a lower face of the stacked body 53B. In addition, the to-be-etched layers 52 each provided between the plurality of electrode layers WL are exposed in the pair of holes 70.

Figure 5B:
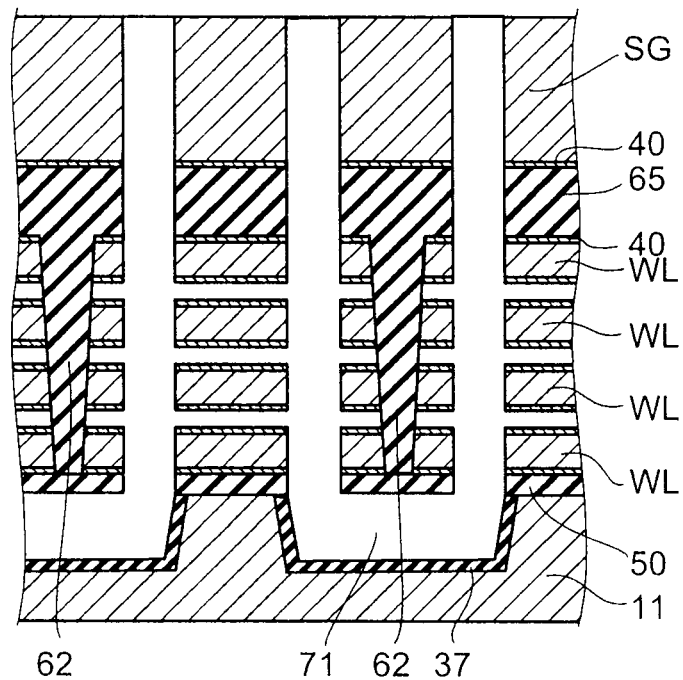

Next, as shown in FIG. 5B, the additive-free silicon sacrifice film 15 (to-be-etched region), and the to-be-etched layers 52 provided between each of the plurality of electrode layers WL are removed through the pair of holes 70. For example, by introducing an alkaline chemical solution into the holes 70, the additive-free silicon sacrifice film 15 and the to-be-etched layers 52 are removed through the pair of holes 70.

A KOH (potassium hydroxide) solution is used as the alkaline chemical solution. The electrode layers WL are, for example, boron-added polysilicon layers and the to-be-etched layers 52 are additive-free polysilicon layers. Only the to-be-etched layers 52 as the additive-free polysilicon layers are selectively removed by treatment through the use of the alkaline chemical solution. A space portion (concave portion) 71 connected to the lower ends of the pair of holes 70 is formed on the semiconductor layer 11. After forming the pair of holes 70, the surface of each of the plurality of electrode layers WL is exposed.

Then, as shown in FIG. 6A, the memory film 30A including the charge storage film 32 is formed on a side wall of each of the pair of holes 70. Furthermore, the insulating films 30B is formed between the plurality of electrode layers WL. In addition, an insulating layer 30C including the charge storage film 32 is formed on an inner wall of the space portion 71. The memory film 30A, the insulating films 30B and the insulating layer 30C are formed by, for example, an atomic layer deposition method (ALD method).

Subsequently, the channel body layer 20 is formed on the surface of the memory film 30A and the surface of the insulating layer 30C. Modes in which the channel body layer 20 is completely filled in the holes 70 and the space portion 71, and furthermore, in which the channel body layer 20 is not completely filled and is formed into a tubular shape, also fall within the embodiment.

Next, as shown in FIG. 6B, the selection gate SG is separated by the photolithography process, and the drain side selection gate SGD and the source side selection gate SGS are formed. After that, other members (contact electrode, wiring, etc.) are formed, and the nonvolatile semiconductor memory device 1 is formed.

The nonvolatile semiconductor memory device 1 shown in FIG. 6B includes the semiconductor layer 11 containing an impurity element. The semiconductor layer 11 corresponds to the back gate BG illustrated in FIG. 1.

The nonvolatile semiconductor memory device 1 includes the insulating layer 30C provided on the surface of the semiconductor layer 11. The nonvolatile semiconductor memory device 1 includes the stacked body 53A having the plurality of electrode layers WL and the plurality of insulating films 30B, which are alternately stacked on the semiconductor layer 11 and the insulating layer 30C, and the diffusion suppressing layers 40 each provided between each of the plurality of electrode layers WL and each of the plurality of insulating films 30B. The plurality of electrode layers WL are the electrode layers WL1D, the electrode layers WL2D, the electrode layers WL3D, the electrode layers WL4D, the electrode layers WL1S, the electrode layers WL2S, the electrode layers WL3S and the electrode layers WL4S.

The nonvolatile semiconductor memory device 1 includes the charge storage film 32 provided on the side wall of each of the pair of holes 70 formed by penetrating the stacked body 53A in the stacking direction of the stacked body 53A.

The nonvolatile semiconductor memory device 1 includes the channel body layer 20 on each of the charge storage films 32 in the pair of holes 70.

The nonvolatile semiconductor memory device 1 includes a stacked body 54 provided on the stacked body 53A. The stacked body 54 has the interlayer insulating film 65 and the selection gate SG provided on the interlayer insulating film 65. The selection gate SG is the drain side selection gate SGD and the source side selection gate SGS. The diffusion suppressing layer 40 may be interposed between the interlayer insulating film 65 and the selection gate SG.

The nonvolatile semiconductor memory device 1 includes the gate insulating films GD provided on the side walls of the holes 70 formed by penetrating the stacked body 54 in the stacking direction of the stacked body 54. The gate insulating films GD are the gate insulating film GD of the drain side selection gate SGD and the gate insulating film GD of the source side selection gate SGS. The nonvolatile semiconductor memory device 1 includes the channel body layer 20 also on the gate insulating films GD in the holes 70.

In the nonvolatile semiconductor memory device 1, lower ends of the channel body layer 20 formed in the pair of holes 70 are connected to each other in the insulating layer 30C. The insulating layer 30C functions as a back gate insulating film of the back gate BG.

The nonvolatile semiconductor memory device 1 includes the insulating layer 62 which is sandwiched between the pair of holes 70, penetrates the stacked body 53A from the stacked body 53A, and reaches the insulating layer 50.

Next, effects at the time when the diffusion suppressing layers 40 are provided on and under the electrode film WL will be explained. Before that, a reference example as an embodiment which is different from the first embodiment will be explained.

Figure 7A:
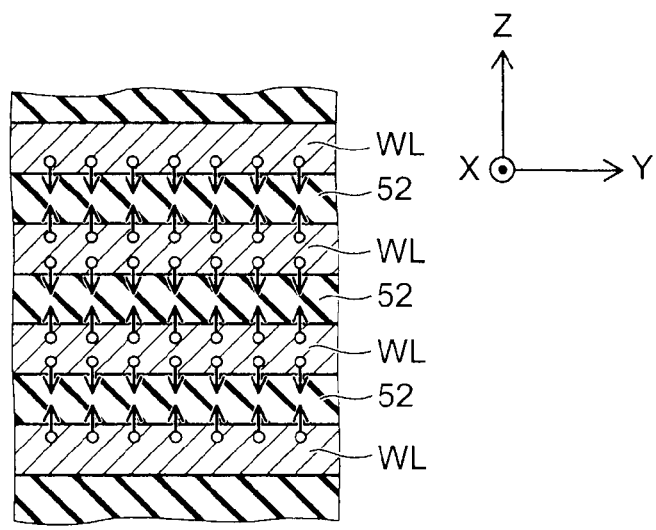
FIGS. 7A to 7C are schematic cross-sectional views for explaining a manufacturing process of a nonvolatile semiconductor memory device according to a reference example.
Figure 7B:
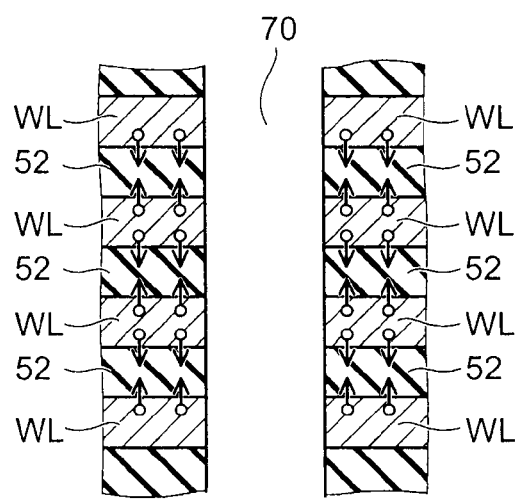
Figure 7C:
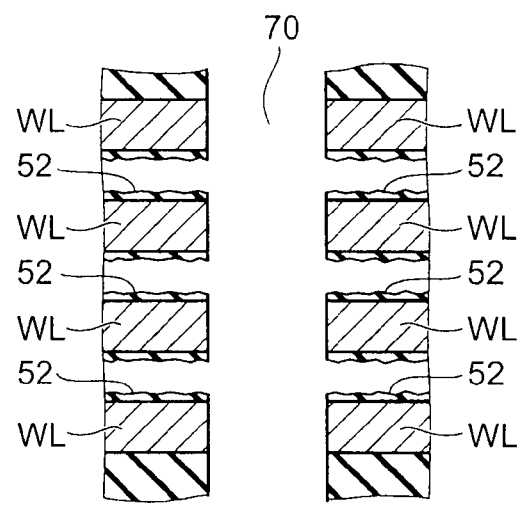

FIGS. 7A to 7C are schematic cross-sectional views for explaining a manufacturing process of a nonvolatile semiconductor memory device according to the reference example.

In the reference example, as shown in FIG. 7A, a manufacturing process is caused to proceed without providing the diffusion suppressing layers 40 on and under the electrode layer WL. Heat is applied to the stacked body 53B to be processed by a film-forming process and a photolithography process. Accordingly, there is a case in which the impurity element contained in the electrode layers WL diffuses into the to-be-etched layers 52 during the manufacturing process. For example, circles in the figures represent the impurity element and arrows represent diffusing directions of the impurity element. In the manufacturing process, when heat is increasingly applied to the stacked body 53B, there is a case in which the impurity element contained in the electrode layers WL also diffuses into the to-be-etched layers 52. In this case, the impurity concentration after heating becomes lower than the impurity concentration before heating as a whole, and the impurity concentration profile in the depth direction of the electrode layers WL becomes relatively flat.

Accordingly, after the holes 70 are formed in the stacked body 53B, as shown in FIG. 7B, the electrode layers WL to which the impurity element is added and the to-be-etched layers 52 to which the impurity element is added are exposed in the holes 70. Principal ingredients of the electrode layers WL and the to-be-etched layers 52 are silicon. In addition, both layers contain the same impurity element. For this reason, in the reference example, the etching selection ratio between the electrode layers WL and the to-be-etched layers 52 is low.

In such a state, when alkaline solution is filled in the holes 70, there is a case in which the to-be-etched layers 52 are not sufficiently removed and the to-be-etched layers 52 remain on and under the electrode layers WL as residues. This state is shown in FIG. 7C.

The to-be-etched layers 52 as the residues are added to the impurity element and have electrical conductivity. The existence of the residues make the interval between the electrode layers WL smaller than intended. Consequently, in the reference example, there is a possibility that insulation properties between the electrode layers WL degrade.

In contrast to this, in the first embodiment, the diffusion suppressing layers 40 are provided on and under the electrode layer WL and cause the manufacturing process to proceed.

Figure 8A:
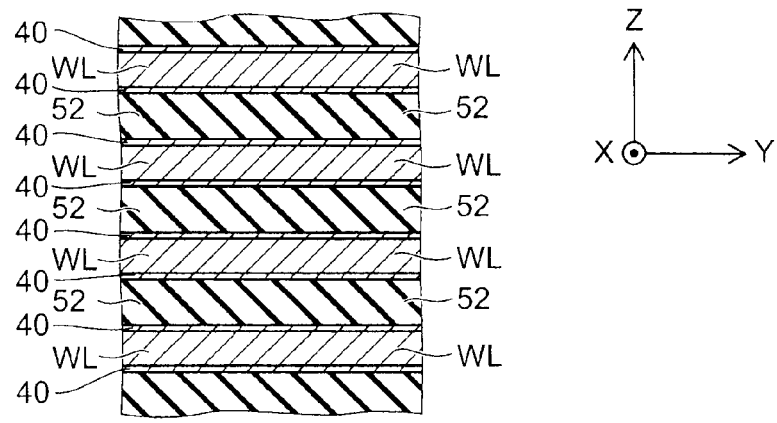
FIGS. 8A to 8C are schematic cross-sectional views for explaining the manufacturing process of the nonvolatile semiconductor memory device according to the first embodiment.
Figure 8B:
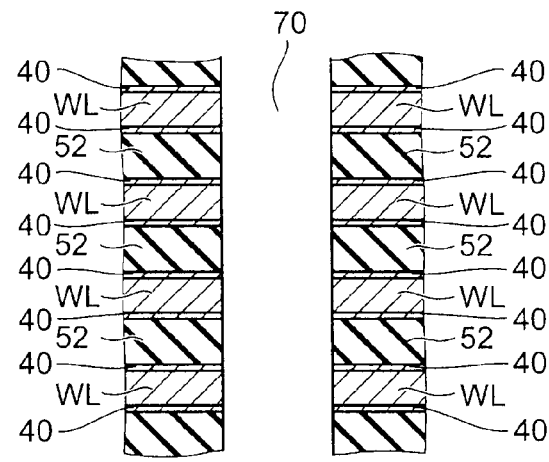
Figure 8C:
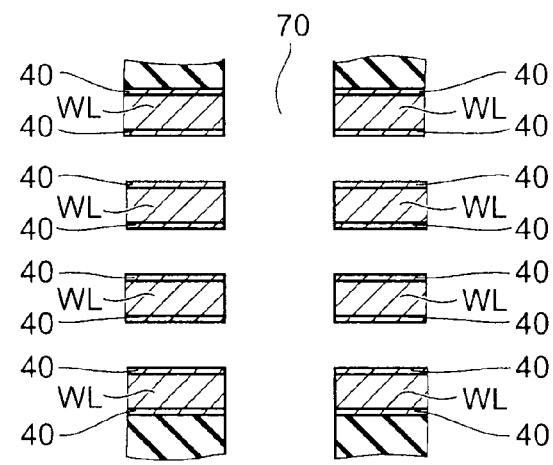

FIGS. 8A to 8C are schematic cross-sectional views for explaining the manufacturing process of the nonvolatile semiconductor memory device according to the first embodiment.

In the first embodiment, as shown in FIG. 8A, the diffusion suppressing layer 40 is interposed between the electrode layer WL and the to-be-etched layer 52. Accordingly, even when heat is applied to the stacked body 53B during the manufacturing process, the impurity element contained in the electrode layer WL is hard to diffuse into the to-be-etched layers 52. The diffusion suppressing layer 40 is a film having the effect of suppressing diffusion of the impurity element into the to-be-etched layers 52. This is because the diffusion suppressing layer 40 serves as a barrier layer for the impurity element contained in the electrode layers WL.

Furthermore, even when the diffusion suppressing layers 40 are provided on and under the electrode layer WL, the principal ingredients of the electrode layers WL, the diffusion suppressing layers 40 and the to-be-etched layers 52 are all silicon. Accordingly, in forming the holes 70 by dry etching, it is not required that the type of etching gas is changed depending on each of the electrode layers WL, the diffusion suppressing layers 40 and the to-be-etched layers 52. That is, the holes 70 can be collectively formed by using the same type of etchant. Since the principal ingredients of the electrode layers WL, the diffusion suppressing layers 40 and the to-be-etched layers 52 are all silicon, the cross-sectional shape of the holes 70 is close to a straight shape.

There are also measures by which silicon carbide (SiC) or silicon nitride ($Si_3N_4$) rather than carbon-containing silicon is used as the material for the diffusion suppressing layers 40. However, silicon carbide (SiC) and silicon nitride ($Si_3N_4$) are different from the principal ingredients of the electrode layers WL and the diffusion suppressing layers 40. For this reason, when the holes 70 are formed by dry etching, a process of switching the etchant to an etchant dedicated to the diffusion suppressing layer is required, and thus the holes 70 cannot be collectively formed by using the same type of etchant. Furthermore, silicon carbide (SiC) and silicon nitride ($Si_3N_4$) are harder to be etched than silicon (Si). Thus, the cross-sectional shape of the holes 70 may become distorted.

Next, in the first embodiment, an alkaline solution is filled in the holes 70 as shown in FIG. 8B. In first embodiment, since the diffusion suppressing layer 40 is provided between the electrode layer WL and the to-be-etched layer 52, the impurity element is hard to be diffused from the electrode layer WL to the to-be-etched layer 52. Consequently, the etching selection ratio between the electrode layer WL and the to-be-etched layer 52 does not become low and thus, as shown in FIG. 8C, the to-be-etched layer 52 is easily removed between the electrode layers WL. After that, the insulating film 30B is formed between the electrode layers WL. Thereby, insulation properties between the electrode layers WL are satisfactorily kept.

In the memory film 30A manufactured by the manufacturing method according to the reference example, data retention may degrade due to a fringe electric field generated at an edge portion of the electrode film WL.

Figure 9A:
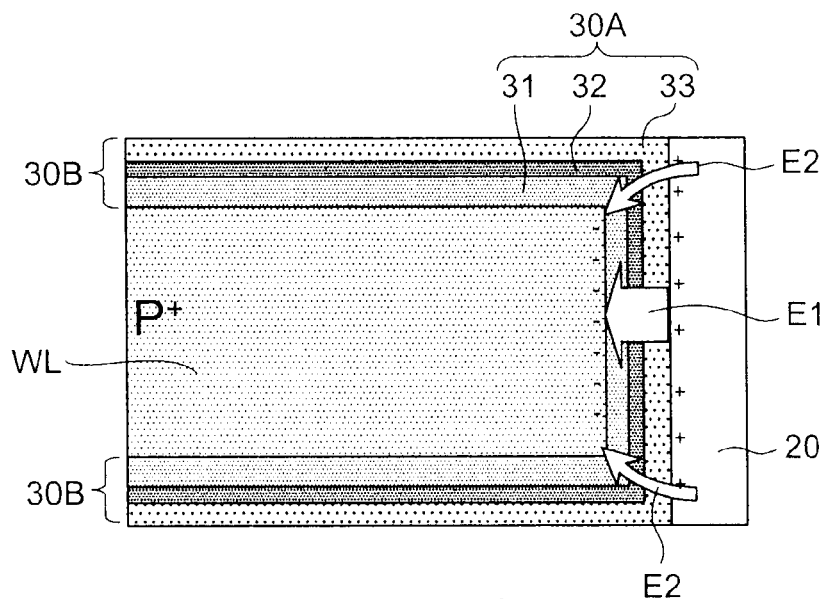
FIGS. 9A and 9B are schematic cross-sectional views showing the vicinity of the memory film of the nonvolatile semiconductor memory device according to the reference example.
Figure 9B:
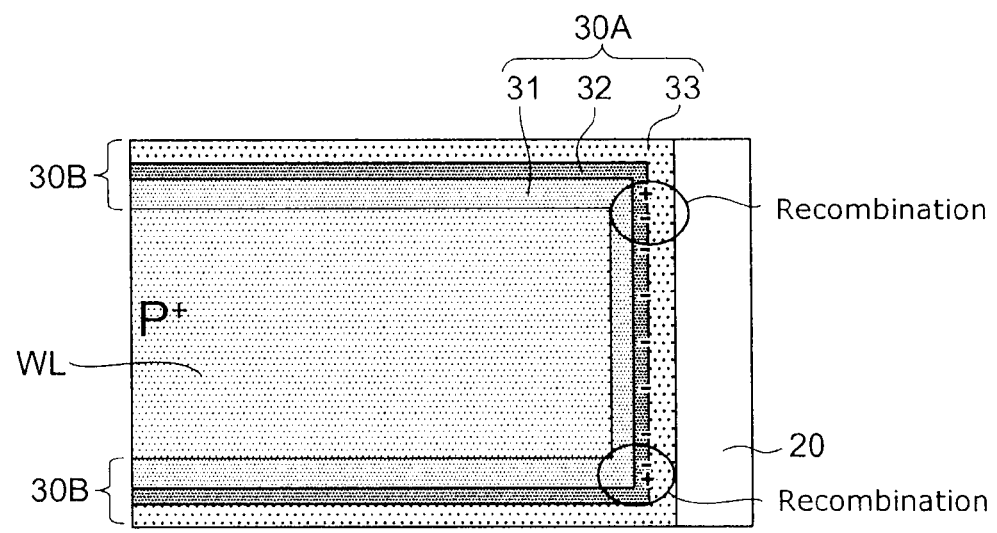

FIGS. 9A and 9B are schematic cross-sectional views showing the vicinity of the memory film of the nonvolatile semiconductor memory device according to the reference example.

In the reference example, the electrode layer WL is in direct contact with the insulating film 30B.

FIG. 9A shows the state at the time of data erasing. At the time of data erasing, a negative potential is applied to the electrode film WL side, and a positive potential is applied to the channel body layer 20. At this time, on the assumption that the electrode film WL is a p-type semiconductor, a depletion layer extends from an interface between the electrode layers WL and the insulating films 30B toward the electrode layers WL.

When the depletion layer is formed, between the electrode film WL and the channel body layer 20, an electric field E1 is formed between the center of the electrode film WL and the channel body layer 20. A fringe electric field E2 is also formed between the edge portion of the electrode film WL and the channel body layer 20. The fringe electric field E2 extends into a part of the insulating films 30B (for example, the insulating films 30B in the vicinity of the edge portion of the electrode film WL). Due to the fringe electric field E2, a positive hole moves from the channel body layer 20 to the charge storage film 32 of the memory film 30A. That is, the positive hole is written to the charge storage film 32 in the vicinity of the edge portion of the electrode film WL.

Next, as shown in FIG. 9B, data is written. At the time of data writing, a positive potential is applied to the electrode film WL side and a negative potential is applied to the channel body layer 20 side. In this case, the above-mentioned depletion layer is not formed, and an electron moves from the channel body layer 20 side to the charge storage film 32 of the memory film 30A. That is, the electron is written to the charge storage film 32 of the electrode film WL.

However, the positive hole is already written to the charge storage film 32 in the vicinity of the edge portion of the electrode film WL at the time of erasing. For this reason, after data writing, recombination of the positive hole and the electron occurs in the charge storage film 32 in the vicinity of the edge portion of the electrode film WL. That is, there is a possibility that a part of the electron stored in the charge storage film 32 may disappear. Accordingly, in the reference example, data retention may degrade. Especially when the nonvolatile semiconductor memory device becomes smaller and the electrode film WL becomes thinner, this degradation of data retention emerges remarkably.

In contrast to this, the nonvolatile semiconductor memory device according to the first embodiment is hard to cause degradation of data retention in comparison with the nonvolatile semiconductor memory device of the reference example.

Figure 10A:
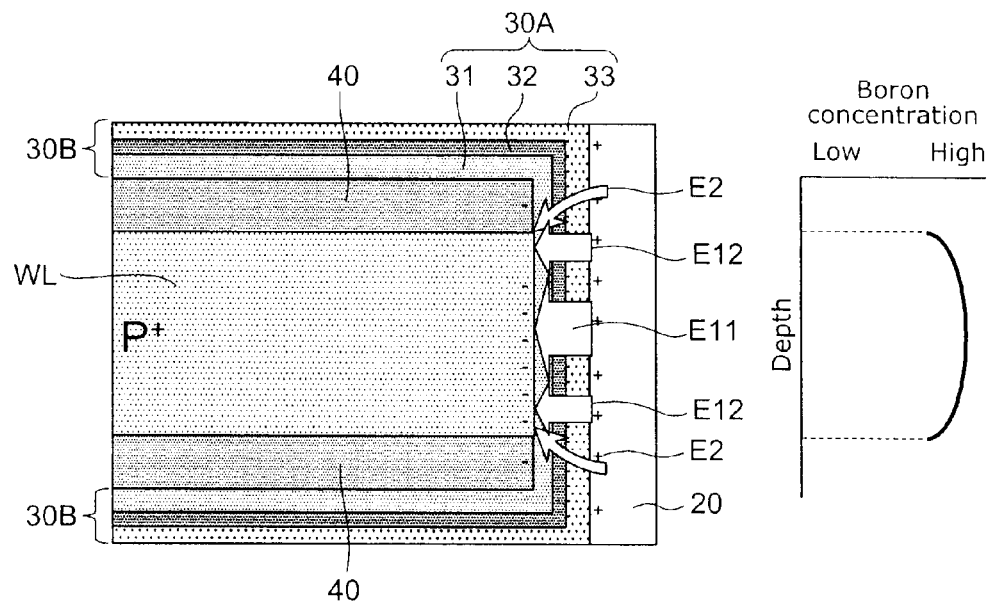
FIGS. 10A and 10B are schematic cross-sectional views showing the vicinity of the memory film of the nonvolatile semiconductor memory device according to the first embodiment.
Figure 10B:
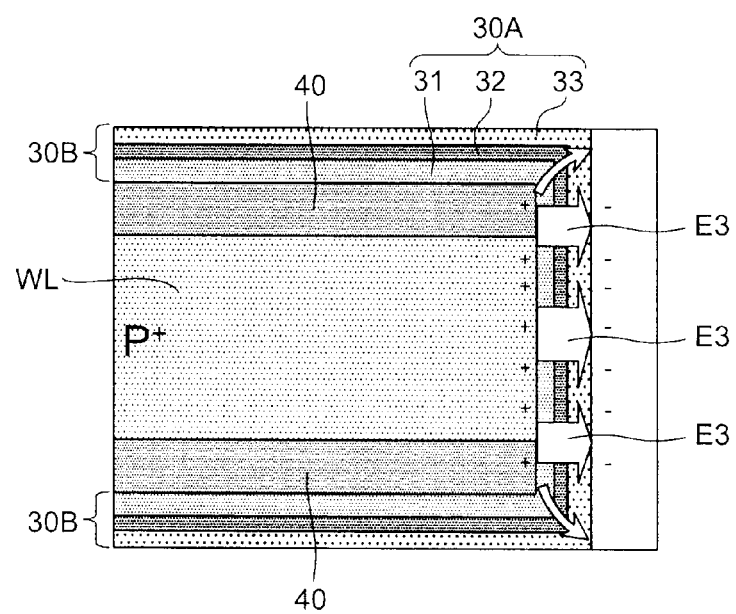

FIGS. 10A and 10B are schematic cross-sectional views showing the vicinity of the memory film of the nonvolatile semiconductor memory device according to the first embodiment.

In the nonvolatile semiconductor memory device 1 according to the first embodiment, the diffusion suppressing layer 40 is interposed between the electrode layer WL and the insulating film 30B.

FIG. 10A shows a state at the time of data erasing and an impurity concentration profile in the electrode layer WL and the diffusion suppressing layer 40.

As described above, boron contained in the electrode layer WL diffuses out of the electrode layer WL during the manufacturing process. However, since the diffusion suppressing layers 40 are provided on and under the electrode layer WL, boron is hard to diffuse to the to-be-etched layers 52. However, boron is not contained in the diffusion suppressing layers 40 before heating. Accordingly, a certain amount of boron diffuses from the electrode layer WL to the diffusion suppressing layers 40. Therefore, the boron concentration in the electrode layer WL after completion of the manufacturing process is higher at the center of the electrode layer WL between the upper face and the lower face of the electrode layer WL than on the upper face side and the lower face side in the depth direction of the electrode layer WL.

At the time of data erasing, the negative potential is applied to the electrode film WL side and the positive potential is applied to the channel body layer 20. At this time, on the assumption that the electrode film WL is a P-type semiconductor, a depletion layer extends from the interface between the electrode layer WL and the insulating film 30B toward the electrode layer WL side.

Since the extension length of the depletion layer is inversely related to the impurity concentration, the depletion layer becomes shorter at the center of the electrode film WL in the depth direction of the electrode film WL and becomes longer toward the diffusion suppressing layer 40 side. When the depletion layer is formed, an electric field is formed between the electrode film WL and the channel body layer 20. Since the depletion layer is short at the center of the electrode film WL and is longer toward the diffusion suppressing layer 40 sides, a gradient of an electric field E11 formed at the center of the electrode film WL is steeper than a gradient of an electric field E12 formed on the diffusion suppressing layer 40 sides.

Furthermore, the fringe electric field E2 is formed at the edge portion of the highly conductive electrode film WL. However, the fringe electric field E2 does not extend to a part of the insulating film 30B due to the existence of the diffusion suppressing layers 40. That is, the fringe electric field E2 is confined between the electrode film WL and the diffusion suppressing layers 40, and the channel body layer 20. At the time of data erasing, although the positive hole is written to the charge storage film 32 due to the fringe electric field E2, a region in which the positive hole is written due to the fringe electric field E2 serves as the charge storage film 32 between the diffusion suppressing layer 40 and the channel body layer 20.

Next, as shown in FIG. 10B, data is written. At the time of data writing, the positive potential is applied to the electrode film WL side and the negative potential is applied to the channel body layer 20 side. In this case, the depletion layer is not formed, and the electron moves from the channel body layer 20 side to the charge storage film 32 of the memory film 30A. That is, the electron is written to the charge storage film 32 of the electrode film WL.

At the time of data writing, since a so-called forward bias is applied and the depletion layer is not formed, a gradient of an electric field E3 is determined based on a difference between the potential applied to the electrode film WL and the potential applied to the channel body layer 20. Accordingly, the electric field E3 becomes approximately uniform in the depth direction of the electrode film WL. In addition, the diffusion suppressing layer 40 is in direct contact with the electrode film WL. Accordingly, the potential of the diffusion suppressing layer 40 is the same as the potential of the electrode film WL. That is, the gradient of the electric field E3 between the electrode film WL and the diffusion suppressing layers 40, and the channel body layer 20 becomes approximately uniform in the depth direction of the electrode film WL.

The positive hole written to the charge storage film 32 between the diffusion suppressing layer 40 and the channel body layer 20 is erased by the electron moving from the diffusion suppressing layer 40 to the charge storage film 32 due to the electric field E3. That is, in the first embodiment, after data writing, recombination of the positive hole and the electron is hard to occur in the charge storage film 32 in the vicinity of the edge portion of the electrode film WL. That is, in the first embodiment, a part of the electrons stored in the charge storage film 32 between the electrode film WL and the channel body layer 20 does not disappear, and thus degradation of data retention is suppressed.

As described above, in the first embodiment, the nonvolatile semiconductor memory device 1 which can be easily etched and suppresses degradation of data retention.

Second Embodiment

Figure 11:
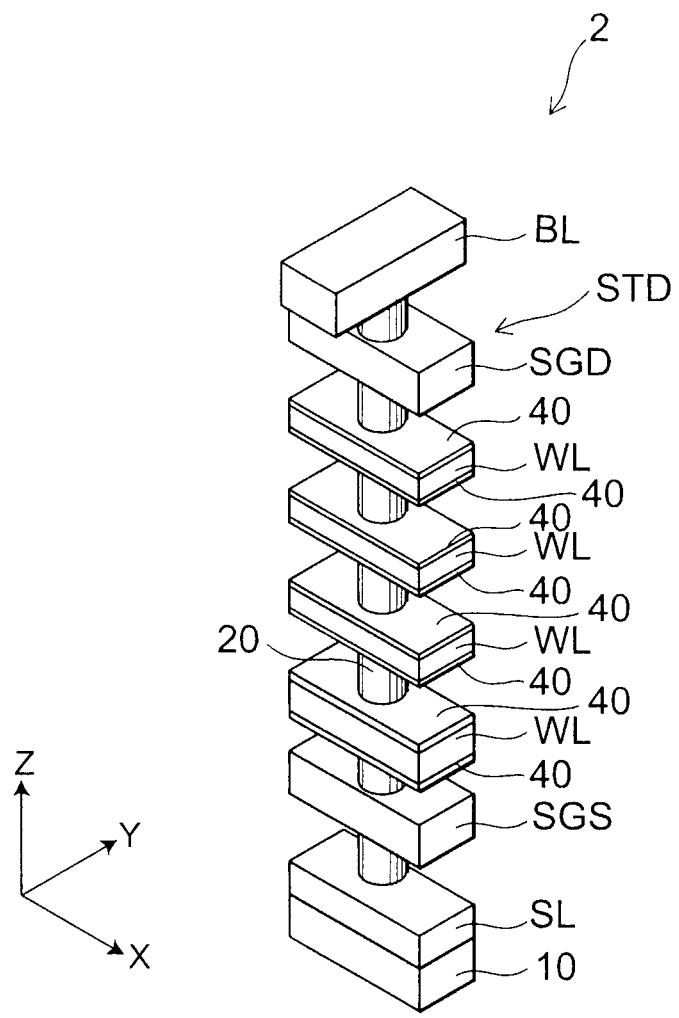
FIG. 11 is a schematic perspective diagram showing a memory cell array in a nonvolatile semiconductor memory device according to a second embodiment.

FIG. 11 is a schematic perspective diagram showing a memory cell array in a nonvolatile semiconductor memory device according to a second embodiment.

In the nonvolatile semiconductor memory device 2 according to the second embodiment, the memory string is not necessarily limited to be U-shaped and as shown in FIG. 11, may be I-shaped. FIG. 11 shows only the conductive parts and the insulating parts are not shown.

With this configuration, the source line SL is provided on the substrate 10, and the source-side selection gate (or the lower selection gate) SGS is provided thereon, the plurality of (for example, four) electrode layers WL are provided thereon, and the drain-side selection gate (or the upper selection gate) SGD is provided between the uppermost electrode layer WL and the bit line BL. The diffusion suppressing layers 40 are provided on and under each electrode layer WL.

Hereinabove, exemplary embodiments are described with reference to specific examples. However, the embodiments are not limited to these specific examples. That is, also ones in which a person skilled in the art has added a design modification to the specific examples appropriately, are included within the scope of the embodiments to the extent that they are provided with characteristics of the embodiments. Each component and arrangement thereof, material, conditions, shape, size, etc., which each of the specific examples described above includes are not limited to ones illustrated, and are able to be modified appropriately.

Further, each of components which each of the embodiments mentioned above includes is able to be compounded to the extent that they are technically possible, and ones which combines these also are included within the scope of the embodiments to the extent that they include the characteristics of the embodiments. Moreover, it should be understood that in the concept category of the embodiments, a person skilled in the art could have been able to conceive various kinds of the change examples and modification examples, and these change examples and modification examples also are included within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device comprising:
a stacked body including a plurality of electrode layers and a plurality of insulating layers, which are alternately stacked, and diffusion suppressing layers each provided between each of the plurality of electrode layers and each of the plurality of insulating layers;
a memory film provided on a side wall of a hole penetrating the stacked body in a stacking direction; and
a channel body layer provided on the memory film,
each of the plurality of electrode layers being a first semiconductor layer containing a first impurity element,
the diffusion suppressing layer being a second semiconductor layer containing a second impurity element which is different from the first impurity element, and
the diffusion suppressing layer being a film having an effect of suppressing diffusion of the first impurity element.

2. The device according to claim 1, wherein a concentration of the first impurity element in a depth direction of the first semiconductor layer is relatively higher at the center of the first semiconductor layer between an upper face and a lower face of the first semiconductor layer than at the upper face and the lower face.

3. The device according to claim 1, wherein each of the plurality of electrode layers is a gate electrode facing the channel body layer via the memory film.

4. The device according to claim 1, wherein the first impurity element is a group XIII element or a group XV element.

5. The device according to claim 1, wherein the second impurity element is carbon.

6. The device according to claim 1, wherein a principal ingredient of the first semiconductor layer and a principal ingredient of the second semiconductor layer are silicon.

7. The device according to claim 1, wherein the first semiconductor layer and the second semiconductor layer are made of polycrystalline silicon.

8. The device according to claim 1, wherein the diffusion suppressing layer does not intervene between the memory film provided on the side wall of the hole and the electrode layer.

9. A nonvolatile semiconductor memory device comprising:
a stacked body including a plurality of electrode layers and a plurality of insulating layers, which are alternately stacked, and diffusion suppressing layers each provided between each of the plurality of electrode layers and each of the plurality of insulating layers; and
a memory film provided on a side wall of a hole penetrating the stacked body in a stacking direction,
each of the plurality of electrode layers being a first semiconductor layer containing a first impurity element,
the diffusion suppressing layer being a second semiconductor layer containing a second impurity element which is different from the first impurity element, and the diffusion suppressing layer being a film having an effect of suppressing diffusion of the first impurity element.

10. The device according to claim 9, wherein a concentration of the first impurity element in a depth direction of the first semiconductor layer is relatively higher at the center of the first semiconductor layer between an upper face and a lower face of the first semiconductor layer than at the upper face and the lower face.

11. The device according to claim 9, wherein each of the plurality of electrode layers is a gate electrode facing a channel body layer via the memory film.

12. The device according to claim 9, wherein the first impurity element is a group XIII element or a group XV element.

13. The device according to claim 9, wherein the second impurity element is carbon.

14. The device according to claim 9, wherein a principal ingredient of the first semiconductor layer and a principal ingredient of the second semiconductor layer are silicon.

15. The device according to claim 9, wherein the first semiconductor layer and the second semiconductor layer are made of polycrystalline silicon.

16. The device according to claim 9, wherein the diffusion suppressing layer does not intervene between the memory film provided on the side wall of the hole and the electrode layer.

* * * * *